United States Patent [19]
Ogino et al.

[11] Patent Number: 5,825,794
[45] Date of Patent: Oct. 20, 1998

[54] SEMICONDUCTOR LASER DEVICE

[75] Inventors: Shinji Ogino, Kanagawa; Shoji Kitamura, Kanagawa; Yoichi Shindo, Kanagawa; Naokazu Sakamoto; Koji Nemoto, both of Saitama, all of Japan

[73] Assignee: Fuji Electric Co., Ltd., Japan

[21] Appl. No.: 779,170

[22] Filed: Dec. 27, 1996

[30] Foreign Application Priority Data

Dec. 28, 1995 [JP] Japan .................................. 7-342017

[51] Int. Cl.$^6$ .................................................. H01S 3/043
[52] U.S. Cl. ............................... 372/36; 257/99; 257/100
[58] Field of Search ................................ 372/36; 257/99, 257/100

[56] References Cited

U.S. PATENT DOCUMENTS 5,444,726  8/1995  Kitamura et al. ......................... 372/36

Primary Examiner—James W. Davie
Attorney, Agent, or Firm—Rossi & Associates

[57] ABSTRACT

A semiconductor laser device is provided which includes: a metallic main plate to which a laser diode chip is fixed through a sub-mount incorporating a photo diode and which serves as an electric common for these diodes; three metallic posts that are electrically connected by wires to the main plate, laser diode chip and photo diode, respectively, and are spaced apart from the main plate; and a resin case in which the laser diode chip and sub-mount are sealed and to which fixing end portions of the main plate are fixed. The resin case secures the main plate and the three posts in position such a way as to avoid direct contact therebetween.

5 Claims, 2 Drawing Sheets

SEMICONDUCTOR LASER DEVICE

FIELD OF THE INVENTION

The present invention relates to a semiconductor laser device used for an optical disc device, wherein a laser diode chip is sealed in a resin case.

BACKGROUND OF THE INVENTION

Semiconductor laser devices are incorporated for use in various kinds of optical application apparatus for optical discs, such as a compact disc, a laser beam printer and the like. Since a spot of a laser beam emitted by the laser device is often narrowed down to the limit of optical diffraction, the position and orientation of its light source, namely, a light-emitting point of a laser diode chip, need to be fixed or determined with extremely high accuracy.

To this end, a can-type semiconductor laser device has been principally used in which a laser diode chip and other components are accommodated in a metallic base and a can with a glass window which have a relatively high mechanical strength. This can-type semiconductor laser device, however, is undesirably heavy due to the weights of the metallic base, heat sink and can, and, in particular, prevents an optical head of the optical disc device from reducing its weight and size. Further, the can with the window and other components of this laser device are undesirably expensive.

To solve the above problems, a lightweight, inexpensive semiconductor laser device has been proposed in which a laser diode chip is sealed in a resin case. In particular, such a resin-seal-type semiconductor laser device is characterized by a manufacturing method that employs a lead frame capable of handling a multiplicity of semiconductor laser devices at a time.

FIG. 4 is a perspective view of a known resin-seal-type semiconductor laser device. In this laser device, a laser diode chip 1 is bonded to a sub-mount 2 (Si crystal) incorporating a photo diode, which in turn is bonded to a main plate 3 that is formed integrally with a common post 4a. The laser diode chip 1 and the photo diode are connected to wires (not shown), which are respectively connected to the other two posts 4b that are formed separately from the main plate 3. The common post 4a and posts 4b separately extend from the same lead frame, and lie on the same plane. The laser diode chip 1 is contained and sealed in a translucent resin case 5, and the posts 4a, 4b are secured or fixed by this resin case 5 at predetermined relative positions. The main plate 3 has fixing end portions 3a that protrude from the resin case 5 to be fixed to jigs of an optical application apparatus in which the semiconductor laser device is mounted. The end portions of the posts 4a, 4b also protrude from the resin case 5 to be connected by soldering to a lead that leads to a drive source of the laser diode chip 1 and a lead that leads to an optical output monitor circuit.

The above resin-seal-type semiconductor laser device is characterized in that its shape can be selected with an increased degree of freedom, so that the contour of the device corresponds to that of the optical application apparatus in which the laser device is mounted.

As in the case of the can-type semiconductor laser device, the resin-seal-type semiconductor laser device is normally attached to the optical application apparatus through a metallic adapter suitable for the optical application apparatus, so that the position of the laser diode chip can be finely adjusted. FIG. 5(a) is a plane view of the semiconductor laser device that is assembled with the adapter, and FIG. 5(b) is a cross sectional view taken along a line Y—Y of FIG. 5(a) that is parallel to the optical axis of the laser device. The adapter 8 is often formed in a cylindrical shape so that it can be rotated about the optical axis 6, and is assembled with the laser device such that the optical axis 6 is aligned with the center axis of the adapter 8. The end portions 3a of the semiconductor laser device are fixed to the adapter 8 with adhesives or by caulking.

Where the resin-seal-type semiconductor laser device is incorporated in the optical application apparatus and a lead is soldered to the central common post 4a, however, the heat is conducted from a soldering iron or fused solder to the common post 4a, and then directly transmitted to the photo diode chip and laser diode chip. As a result, a solder applied to bonded portions of the photo diode chip and laser diode chip may be fused again, causing a change in the electrical conductivity between these diode chips due to inappropriate or insufficient bonding therebetween, or the laser diode chip may be broken because of the heat transmitted thereto. To avoid these problems, the temperature of the soldering iron or fused solder liquid and the soldering time need to be strictly controlled or monitored during the soldering step.

When the posts are inserted, while visually observed, into designated terminal holes formed in a flexible substrate or the like, there is the danger of bending the posts that fail to be fully inserted, since the center of the adapter or semiconductor laser device as visually seen is not aligned with the center axis of the common post.

SUMMARY OF THE INVENTION

It is therefore a first object of the present invention to provide a resin-seal-type semiconductor laser device which is sufficiently resistant to heat generated during a soldering step. It is a second object to provide a resin-seal-type semiconductor laser device having posts that can be easily inserted into terminal holes while visually observed.

The above object may be accomplished according to the present invention, which provides a semiconductor laser device which includes: a metallic main plate to which a laser diode chip is fixed through a sub-mount incorporating a photo diode and which serves as an electric common for these diodes and has at least one fixing end portion; three metallic posts that are electrically connected by wires to the main plate, laser diode chip and photo diode, respectively, and are spaced apart from the main plate; and a resin case in which the laser diode chip, the sub-mount, a part of the main plate, and parts of the three posts are sealed, which resin case secures the main plate and the three posts in position in such a way as to avoid direct contact therebetween.

Preferably, at least an end portion of the post, which portion protrudes from the resin case, has a center axis that is aligned with an optical axis of a laser beam emitted by the laser diode chip.

In another aspect of the present invention, there is provided a semiconductor laser device which includes: a metallic main plate to which the laser diode chip and the photo diode are fixed; metallic posts that are spaced apart from the main plate and are electrically connected by wires to the main plate; and a resin case in which the laser diode chip, a part of the main plate, and parts of the metallic posts are sealed.

The semiconductor laser device as described just above may further include a sub-mount incorporating a photo diode, which is disposed between the laser diode chip and the main plate.

BRIEF DESCRIPTION OF THE DRAWINGS

The invention will be described in greater detail with reference to certain preferred embodiments thereof and the accompanying drawings, wherein.

DETAILED DESCRIPTION OF THE PREFERRED EMBODIMENT

Figure 1:
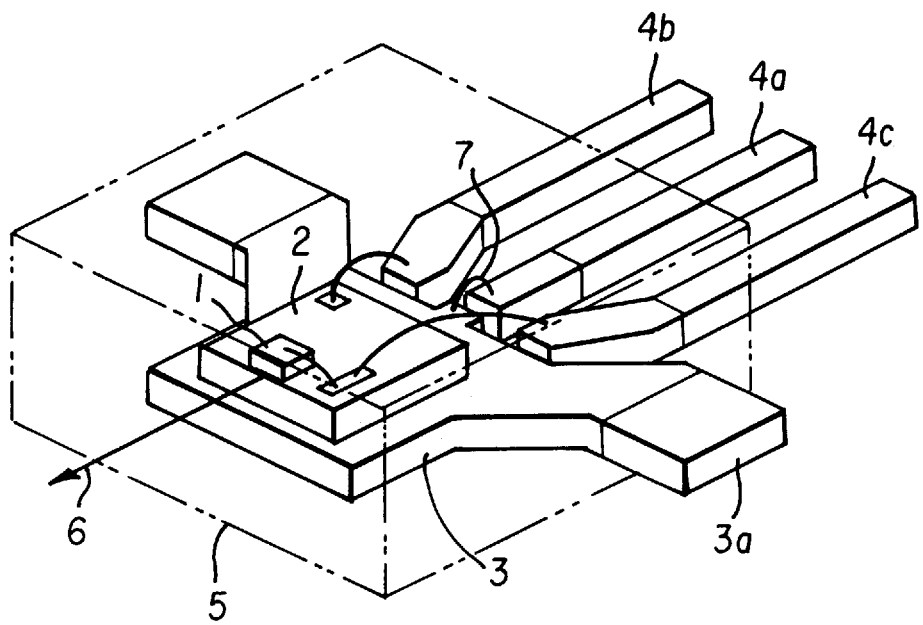
FIG. 1 is a perspective view of a semiconductor laser device constructed as the first embodiment of the present invention.

There will be described in detail one preferred embodiment of the present invention. FIG. 1 is a perspective view showing a semiconductor laser device constructed according to the present invention. Laser diode chip 1 is bonded onto a sub-mount 2 by eutectic soldering using an alloy of gold and tin. The sub-mount 2, which incorporates a photo diode (not shown) for monitoring a laser beam emitted by the laser diode chip 1, is bonded to a main plate 3 by silver paste. The main plate 3 serves as an electric common for these elements 1, 2. A wire 7 is bonded to this main plate 3 and a common post 4a for electrical conduction therebetween. A wire bonded to the laser diode chip 1 is connected to a post 4b through a wiring pad on the sub-mount 2, for electrical conduction between the diode chip 1 and the post 4b. The wire bonded to the laser diode chip 1 may be directly connected to the post 4b, without passing the wiring pad on the sub-mount 2. The photo diode incorporated in the sub-mount 2 is electrically connected by a wire to another post 4c. The laser diode chip 1 and the sub-mount 2 are completely sealed in a resin case 5, and the main plate 3 and the three posts 4a, 4b, 4c are secured by the resin case 5 at predetermined relative positions. The fixing end portions 3a of the main plate 3 and end portions of the posts 4a, 4b, 4c protrude from the resin case 5, for connection with leads of an optical application apparatus in which the present laser device is mounted.

At the outset of fabrication, the main plate 3 and posts 4a–4c of these devices are coupled to a single lead frame at their portions that are to be located outside the resin case 5. Connection of the laser diode chip 1 with the sub-mount 2, wire bonding, and sealing of the diode chip 1 and sub-mount 2 within the resin case 5 are carried out while the main plate 3 and posts 4a–4c are coupled to the lead frame. After sealing with the resin case, the main plate 3 and posts 4a–4c are cut and divided from the single lead frame.

In the semiconductor laser device of the invention as described above, the main plate is spaced from the respective posts 4a, 4b, 4c with the resin case 5 interposed therebetween, and is electrically connected to the posts 4a, 4b, 4c only by thin wires that serve as conductors. Accordingly, the heat generated when leads are soldered to the posts is transmitted to the main plate 3 only due to heat conduction through the wires and the resin, thus giving the present laser device considerably increased heat resistance as compared with the conventional device wherein the main plate and common post are formed integrally with each other. Even if the posts contact the soldering iron or fused solder at an appropriately elevated temperature, this does not cause deterioration or damage of the laser diode chip 1 unless the contact lasts for an excessively long time, nor cause re-fusion of the solder applied to the bonded portions of the laser diode chip 1 and the sub-mount 2, thus maintaining appropriate bonding therebetween. Thus, the semiconductor laser device of the present invention has sufficient resistance to heat resulting from soldering.

First Embodiment

Samples of the semiconductor laser device were fabricated based on the first embodiment of the present invention as described above. These samples were used with a lead frame made of a copper alloy and having a thickness of 0.25 mm.

For each sample, the width of the posts was controlled to 0.35 mm, and the distance between the main plate 3 and the post 4a was controlled to 0.3 mm. The posts had a cross sectional area of 0.0875 mm$^2$. Gold wires having a diameter of 25 $\mu$m were used as bonding wires. The length and cross sectional area of each wire were controlled to 1 mm and 4.91×10$^{-4}$ mm$^2$, respectively. The resin case 5 was formed of epoxy resin.

The heat resistance between the common post 4a and the main plate 3, when calculated assuming that the thermal conductivities of the lead frame, epoxy resin and gold wire were 260 W/(m·K), 0.188 W/(m·K) and 320 W/(m·K), respectively, depended upon or was determined by the heat resistance of the gold wire, and became about 500 times as that obtained with respect to the conventional laser device wherein the common post and the main plate were formed integrally with each other. The thus calculated heat resistance is substantially equivalent to that between the other posts and the main plate.

A heat resistance test was conducted on 22 samples of the above-described semiconductor laser device of the present invention to examine the heat resistance, and the test results were compared with those obtained with respect to 22 samples of the above-described conventional semiconductor laser device. In the test, changes in the electric characteristic and optical output characteristic of each sample were measured after the end portions of the posts were immersed for 5 seconds in fused solders held at various temperatures. More specifically, the oscillating current and voltage at the optical output of 3 mW and the monitor current of the photo diode were measured, and those that experienced a 10% or larger change in any of these characteristics compared to the same characteristics measured prior to the immersion were determined as being defective. Table 1 shows the results of the soldering heat resistance test with respect to the semiconductor laser devices according to the present invention and the conventional semiconductor laser devices.

TABLE 1

| Temperature (°C.) | Embodiment | Conventional device |
|---|---|---|
| 290 | 0/22 | 0/22 |
| 300 | 0/22 | 2/22 |
| 310 | 0/22 | 10/22 |
| 320 | 0/22 | 15/22 |
| 330 | 0/22 | 22/22 |
| 340 | 0/22 | |
| 350 | 0/22 | |
| 360 | 0/22 | |

Notes:
Numerator; number of defective devices
Denominator; number of tested devices While all of the conventional laser devices became defective at the fused solder temperature of 330° C., none of the semiconductor laser devices of the present embodiment became defective even at the solder temperature of 360° C., which indicates that the soldering heat resistance was significantly improved according to the present invention.

Since the actual soldering operation is conducted at 300° C. or lower, it is apparent that the semiconductor laser device of this embodiment has a sufficiently high soldering heat resistance.

Second Embodiment

Figure 2:
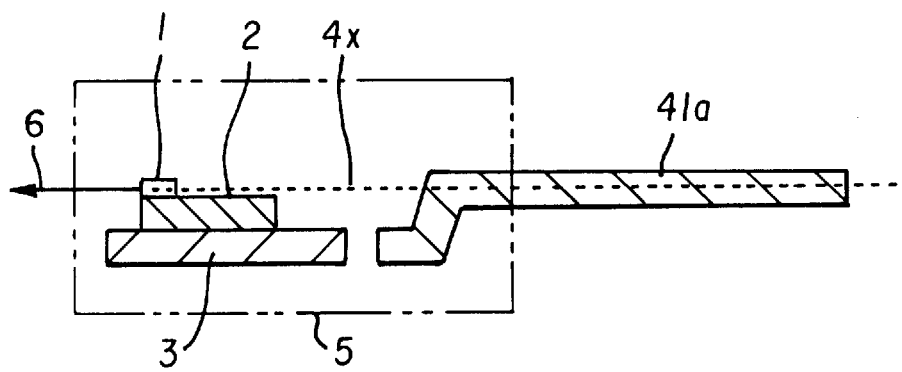
FIG. 2 a cross sectional view taken in a plane parallel to the optical axis of a semiconductor laser device as the second embodiment of the present invention.

FIG. 2 is a cross sectional view taken in a plane parallel to the optical axis of a semiconductor laser device constructed as a second embodiment of the present invention. To produce this embodiment, the semiconductor laser device of the first embodiment was modified by bending each of the three posts by 0.325 mm in total, which is a sum of the thickness (0.2 mm) of the sub-mount 2 and half (0.125 mm) of the thickness of the lead frame, and aligning the center axis 4x of the post 41a with the optical axis 6, so as to set the light-emitting point at the center of the adapter. The post was bent while the laser device was attached to the lead frame before it was sealed in the resin case. The following steps for fabricating this laser device are the same as those of the first embodiment.

The thus obtained semiconductor laser device showed excellent heat resistance upon soldering similarly to the first embodiment, and permitted an easy operation of inserting the posts into designated holes of a flexible sheet, thus reducing a possibility of bending the posts during this operation and making the product defective.

Third Embodiment

Figure 3:
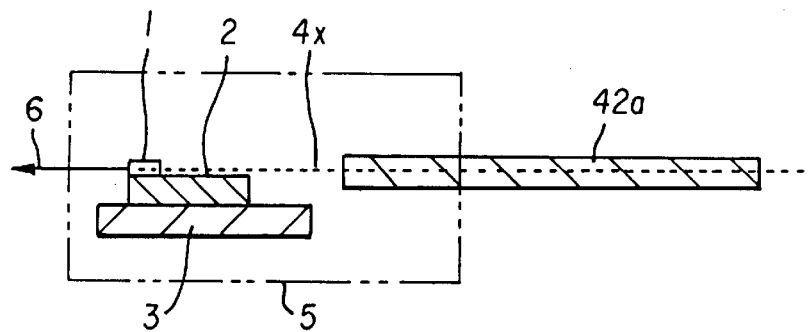
FIG. 3 is a cross sectional view taken in a plane parallel to the optical axis of a semiconductor laser device as the third embodiment of the invention.
Figure 4:
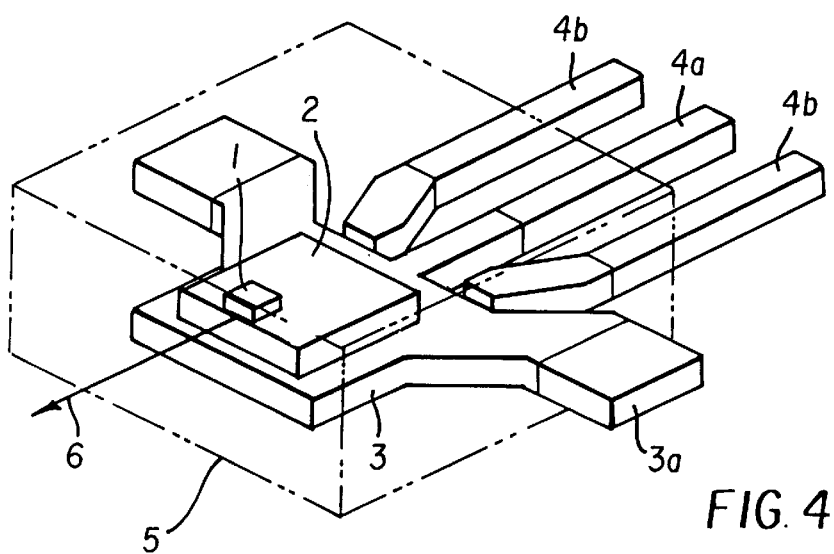
FIG. 4 is a perspective view of a conventional resin-seal type semiconductor laser device.
Figures 5A, 5B:
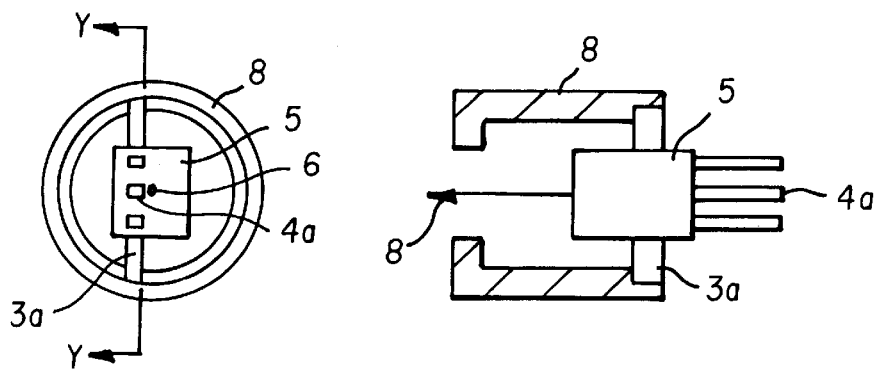
FIG. 5(a) is a plane view showing the semiconductor laser device of FIG. 4 that is assembled with an adapter.
FIG. 5(b) is a cross sectional view taken along line Y—Y of FIG. 5(a) that is parallel to the optical axis.

FIG. 3 is a cross sectional view taken in a plane parallel to the optical axis of a semiconductor laser device constructed as a third embodiment of the present invention. In this embodiment, the center axis 4x of the post 42a was shifted from the main plate 3 and was aligned with the optical axis 6. This shifting of the center axis 4x was effected while the laser device was attached to the lead frame before it was sealed in the resin case. The following steps for fabricating this laser device were the same as those of the first embodiment.

The thus obtained semiconductor laser device showed excellent heat resistance upon soldering similarly to the second embodiment, and was less likely to become defective during its fabrication.

In the semiconductor laser device according to the present invention, the main plate is separated or spaced from all of the metallic posts, and therefore the heat is transmitted to the main plate only through the resin that surrounds the posts and has low thermal conductivity, resulting in a significantly reduced amount of heat transmitted to the photo diode chip and laser diode chip as compared with the conventional laser device. Thus, the semiconductor laser device of the present invention exhibits sufficiently high heat resistance upon soldering. Accordingly, the present semiconductor laser device is free from being defective due to the heat transmitted thereto during the soldering step, thus eliminating a need to strictly control the temperature of the soldering iron or fused solder.

In the arrangement in which the center axis of at least the common post is aligned with the laser optical axis of the laser beam, the post can be easily inserted into a hole of a flexible substrate of a relevant optical apparatus with a reduced possibility of bending the post and making the product defective, which leads to an increased yield of the apparatus in its manufacturing process.

What is claimed is:

1. A semiconductor laser device comprising:
    a laser diode chip having two terminals;
    a photo diode having two terminals;
    a metallic main plate mounting said laser diode chip and said photo diode, said main plate being an electric common electrode plate for a first terminal of said laser diode chip and a first terminal of said photo diode, and having at least a fixing end portion;
    first, second and third metallic posts electrically respectively connected to said main plate, a second terminal of said laser diode chip and a second terminal of said photo diode, respectively, wherein said first, second and third posts being spaced apart from said main plate; and
    a resin case in which said laser diode chip and said photo diode and the space between said main plate and said posts are sealed.

2. A semiconductor laser device according to claim 1, further comprising a sub-mount incorporating said photo diode, which is disposed between said laser diode chip and said main plate.

3. A semiconductor laser device according to claim 1, wherein said posts electrically connected by wires to said main plate.

4. A semiconductor laser device according to claim 1, wherein said at least an end portion of said post, which portion protrudes from said resin case, has a center axis that is aligned with an optical axis of a laser beam emitted by said laser diode chip.

5. A semiconductor laser device according to claim 1, wherein said fixing end portion of said main plate and the opposite end portion of said posts to the end electrically connected to said main plate protrude from said resin case.

* * * * *